(12) United States Patent
Suzuki et al.

(10) Patent No.: US 6,763,495 B2
(45) Date of Patent: Jul. 13, 2004

(54) CRC CODE CALCULATION CIRCUIT AND CRC CODE CALCULATION METHOD

(75) Inventors: Masayoshi Suzuki, Kanagawa (JP); Takao Inoue, Tokyo (JP); Kenjiro Mori, Tokyo (JP)

(73) Assignee: Ando Electric Co., Ltd., Kawasaki (JP)

( * ) Notice: Subject to any disclaimer, the term of this patent is extended or adjusted under 35 U.S.C. 154(b) by 491 days.

(21) Appl. No.: 09/816,513

(22) Filed: Mar. 23, 2001

(65) Prior Publication Data

US 2001/0037481 A1 Nov. 1, 2001

(30) Foreign Application Priority Data

Mar. 31, 2000 (JP) ............................... P. 2000-098138

(51) Int. Cl.[7] .......................................... H03M 13/00
(52) U.S. Cl. ..................... 714/781; 714/757; 714/758; 714/807
(58) Field of Search ............................... 714/781, 757, 714/807, 758; 375/362

(56) References Cited

U.S. PATENT DOCUMENTS 4,939,741 A * 7/1990 Miyazaki .................. 714/781
5,103,451 A * 4/1992 Fossey ..................... 714/757
5,740,210 A * 4/1998 Rokugawa ................ 375/362

FOREIGN PATENT DOCUMENTS

JP         404167715 A * 6/1992 ............... 714/785

* cited by examiner

*Primary Examiner*—Albert Decady
*Assistant Examiner*—Dipakkumar Gandhi
(74) *Attorney, Agent, or Firm*—Fish & Richardson P.C.

(57) ABSTRACT

A CRC code calculation circuit for calculating a CRC code from byte parallel data which is variable-length data. In a CRC code calculation circuit 10 for calculating a CRC code from four-byte parallel data having a residual portion in a final stage, a four-byte parallel CRC code calculation circuit 2 calculates a CRC code in parallel from the four-byte parallel data except the final stage. A byte serial conversion circuit 3 converts data of the final stage into serial data. A one-byte serial CRC code calculation circuit 4 calculates a CRC code in serial from the serial data converted by the byte serial conversion circuit 3 using a calculated result of the four-byte parallel CRC code calculation circuit 2 as an initial value.

5 Claims, 6 Drawing Sheets

CRC CODE CALCULATION CIRCUIT AND CRC CODE CALCULATION METHOD

BACKGROUND OF THE INVENTION

1. Field of the Invention

The present invention relates to a CRC code calculation circuit and a CRC code calculation method for calculating a CRC code from received variable-length data in the receiving side of data.

2. Description of the Related Art

A CRC (Cyclic Redundancy Check) has been conventionally used in order to detect an error of data in digital communication. Here, the CRC means a method for detecting an error of data by comparing a CRC code calculated in a CRC code calculation circuit of the data receiving side with a CRC code calculated in the data sending side.

In recent years, for example, high-speed variable-length data communication for conducting end-to-end communication with low-speed variable-length data (PPP frame) overlaid on a high-speed data frame (SONET/SDH frame) as POS (PPP Over SONET/SDH) has been used widely.

Then, the CRC has been introduced as an error detection method of data in the high-speed variable-length data communication. Here, a CRC code calculation circuit calculates a CRC code from n byte parallel data inputted.

Figure 5:
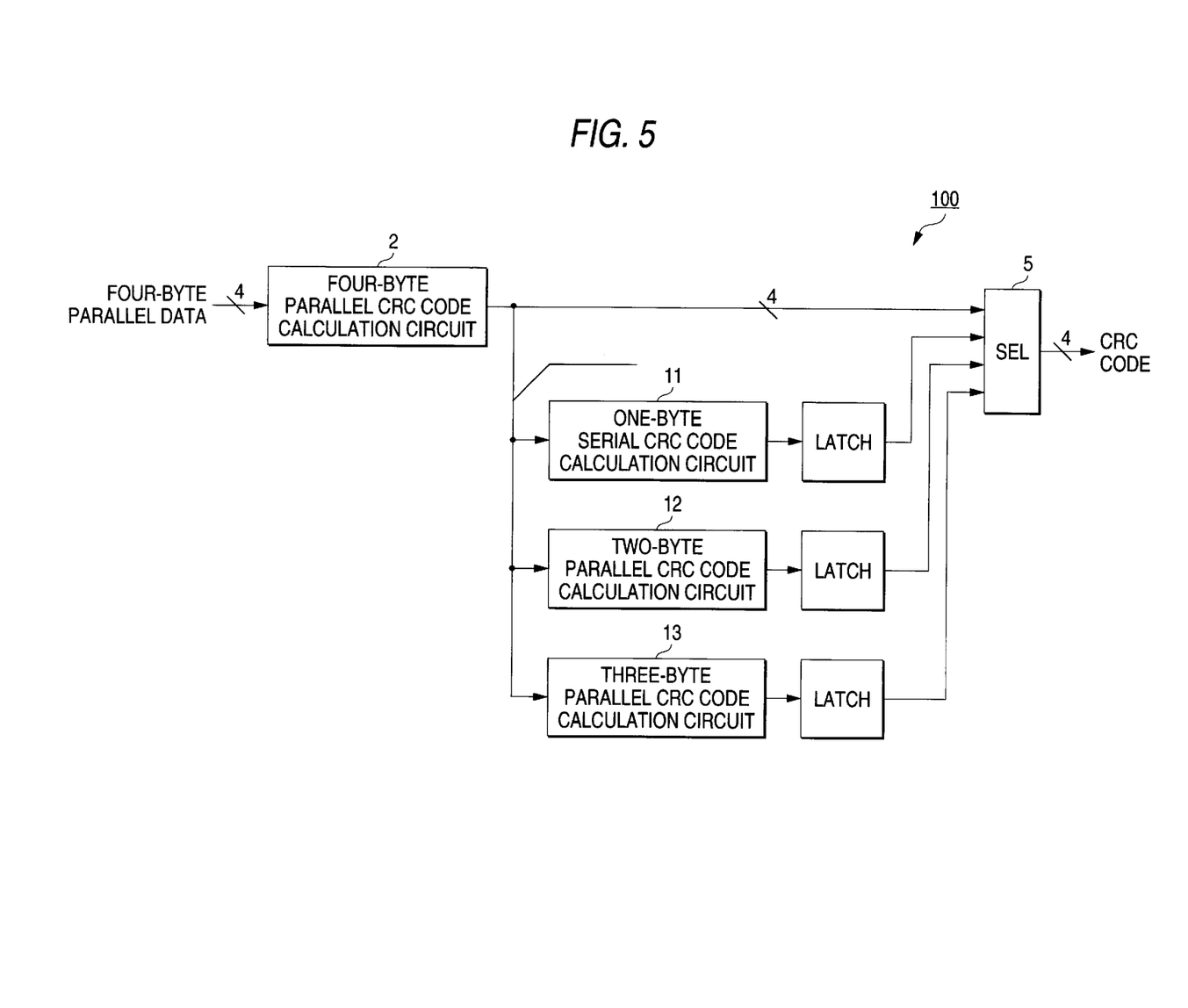
FIG. 5 is a block diagram showing a conventional CRC code calculation circuit 100.

FIG. 5 is a block diagram showing a conventional CRC code calculation circuit 100.

As shown in FIG. 5, the CRC code calculation circuit 100 of four-byte parallel data generally comprises a four-byte parallel CRC code calculation circuit 2, a one-byte serial CRC code calculation circuit 11, a two-byte parallel CRC code calculation circuit 12, a three-byte parallel CRC code calculation circuit 13, and an SEL 5.

The four-byte parallel CRC code calculation circuit 2, whose details are described later, is a circuit for calculating a CRC code from data (see ①, ② of FIG. 6) except for a final stage having a residual portion of four-byte parallel data inputted.

Also, the four-byte parallel CRC code calculation circuit 2 outputs the calculated CRC code to the SEL 5 and also outputs data (see ③ of FIG. 6) of the final stage having a residual portion to one calculation circuit selected by a selection circuit (not shown) of the one-byte serial CRC code calculation circuit 11, the two-byte parallel CRC code calculation circuit 12 and the three-byte parallel CRC code calculation circuit 13.

The one-byte serial CRC code calculation circuit 11, the two-byte parallel CRC code calculation circuit 12 and the three-byte parallel CRC code calculation circuit 13 are circuits for respectively calculating a CRC code from data of the final stage having a residual portion inputted from the four-byte parallel CRC code calculation circuit 2. Also, each the calculation circuit 11, 12 and 13 respectively latches the calculated CRC code and outputs the code to the SEL 5.

The SEL (selector) 5 selectively outputs any one of the CRC codes inputted from each the CRC code calculation circuit 2, 11, 12 and 13.

Next, a procedure of calculating a CRC code from four-byte parallel data will be described with reference to FIG. 6.

Figure 6:
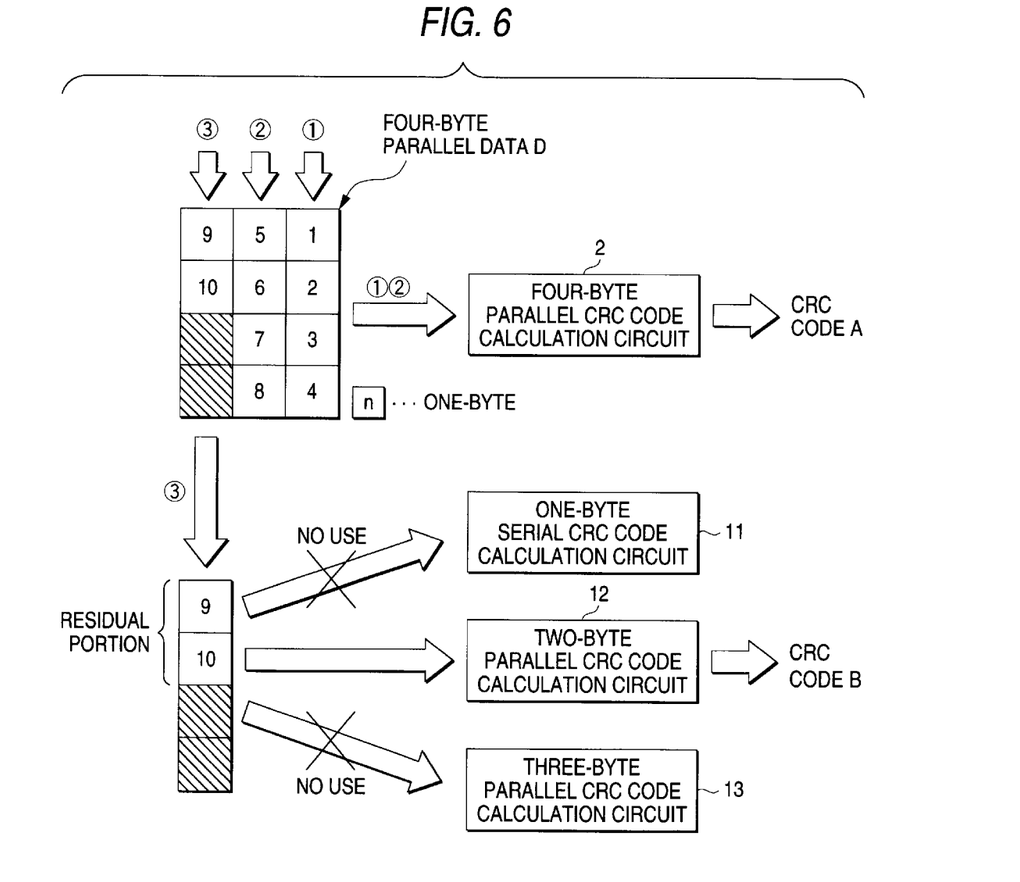
FIG. 6 is a diagram illustrating a conventional procedure of calculating a CRC code from four-byte parallel data.

As shown in FIG. 6, four-byte parallel data D is data having a frame length of ten bytes and consists of three stages of ① (1 to 4), ② (5 to 8) and ③ (9 to 10). Here, the data ③ of the final stage consists of a residual portion 9, 10 and invalid data (shaded areas in FIG. 6) of two bytes.

First, the data ①, ② of the four-byte parallel data D is inputted to the four-byte parallel CRC code calculation circuit 2. Then, the four-byte parallel CRC code calculation circuit 2 calculates a CRC code A from the inputted four-byte parallel data ①, ② and outputs the calculated CRC code A to the SEL (omission of being shown in the drawing).

Next, the data ③ of the four-byte parallel data D is inputted to the two-byte parallel CRC code calculation circuit 12 selected by a selection circuit (not shown) since the residual portion (9, 10) is two bytes. Here, when the residual portion of the four-byte parallel data ③ is one-byte, the four-byte parallel data ③ is inputted to the one-byte serial CRC code calculation circuit 11. Also, when the residual portion is three bytes, the four-byte parallel data ③ is inputted to the three-byte parallel CRC code calculation circuit 13.

Then, the two-byte parallel CRC code calculation circuit 12 calculates a CRC code B from the inputted four-byte parallel data ③ and outputs the calculated CRC code B to the SEL (omission of being shown in the drawing).

Further, the SEL (not shown) selects and outputs any one of the inputted CRC codes A and B.

By the way, the four-byte parallel data of a target for CRC code calculation is variable in the frame length and the residual portion of the final stage changes from one-byte to three bytes, so that a CRC code cannot be calculated by only the four-byte parallel CRC code calculation circuit 2.

As a result of this, the conventional CRC code calculation circuit 100 provides a plurality of the calculation circuits 11, 12, 13 in order to calculate the residual portion of the final stage of the four-byte parallel data, so that a circuit scale became large and manufacturing costs were high.

SUMMARY OF THE INVENTION

An object of the invention is to achieve miniaturization of a CRC code calculation circuit for calculating a CRC code from byte parallel data which is variable-length data and reduce manufacturing costs.

Figure 2:
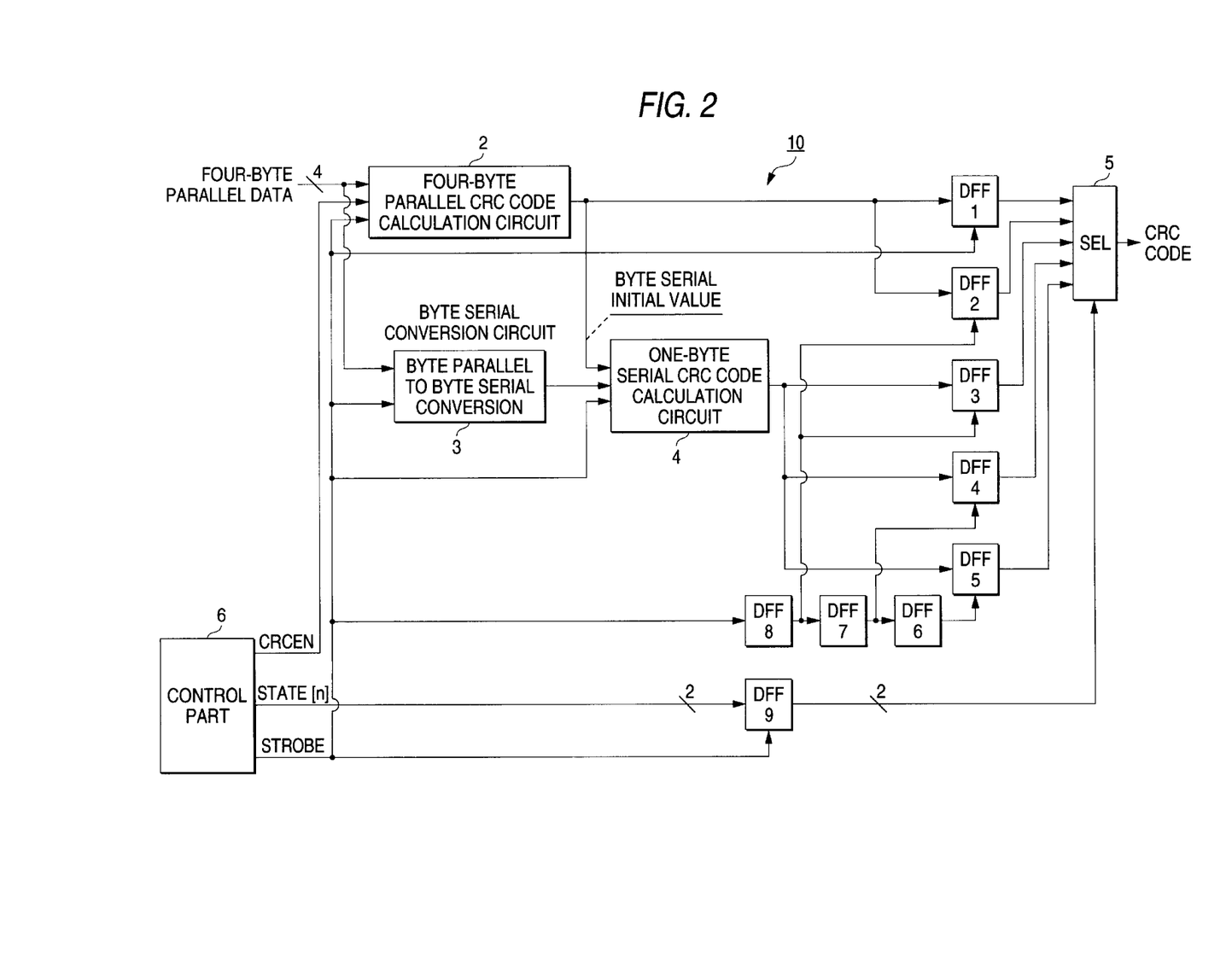
FIG. 2 is a block diagram showing a CRC code calculation circuit 10.

In order to solve the problems, according to a first aspect of the invention, there is provided a CRC code calculation circuit (for example, a CRC code calculation circuit 10 shown in FIG. 2) for calculating a CRC code from parallel data having a residual portion in a final stage, and the CRC code calculation circuit comprises:

parallel calculation means (for example, a four-byte parallel CRC code calculation circuit 2 shown in FIG. 2) for calculating a CRC code in parallel from the parallel data except the final stage;

conversion means (for example, a byte serial conversion circuit 3 shown in FIG. 2) for converting the final stage into serial data;

serial calculation means (for example, a one-byte serial CRC code calculation circuit 4 shown in FIG. 2) for calculating a CRC code in serial from the CRC code calculated by the parallel calculation means and the serial data converted by the conversion means; and CRC code selection means (for example, a SEL 5 shown in FIG. 2) for selecting a desired CRC code from the plural CRC codes calculated by the parallel calculation means and the serial calculation means.

According to the first aspect of the invention, in a CRC code calculation circuit for calculating a CRC code from parallel data having a residual portion in a final stage, by parallel calculation means, a CRC code is calculated in parallel from the parallel data except the final stage, and by conversion means, the final stage is converted into serial data, and by serial calculation means, a CRC code is calculated in serial from the CRC code calculated by the parallel calculation means and the serial data converted by the conversion means, and by CRC code selection means, a desired CRC code is selected from the plural CRC codes calculated by the parallel calculation means and the serial calculation means.

Also, as a second aspect of the invention, by final stage detection means (for example, a control part 6 shown in FIG. 2) further provided in the CRC code calculation circuit as defined in claim 1, the final stage of the parallel data is detected and the conversion means converts the detected final stage into serial data.

According to a fourth aspect of the invention, there is provided a CRC code calculation method for calculating a CRC code from parallel data having a residual portion in a final stage, and the method comprises:

- a final stage detection step of detecting the final stage of the parallel data;
- a conversion step of converting the final stage detected by the final stage detection step into serial data;
- a parallel calculation step of calculating a CRC code in parallel from the parallel data except the final stage;
- a serial calculation step of calculating a CRC code in serial from the parallel calculation result and the serial data converted by the conversion step; and
- a selection step of selecting a desired CRC code from the CRC code calculated by the parallel calculation step and the CRC code calculated by the serial calculation step.

According to the fourth aspect of the invention, in a CRC code calculation method for calculating a CRC code from parallel data having a residual portion in a final stage, the final stage of the parallel data is detected and the detected final stage is converted into serial data. Then, a CRC code is calculated in parallel from the parallel data except the final stage, and a CRC code is calculated in serial from this parallel calculation result and the converted serial data. Further, a desired CRC code is selected from the CRC code calculated in parallel and the CRC code calculated in serial.

Therefore, by converting the final stage of the parallel data into the serial data, CRC code calculation of the residual portion of the parallel data final stage can be calculated by one serial calculation circuit, so that a circuit scale of the CRC code calculation circuit can be decreased and manufacturing costs can be reduced.

Also, as the CRC code calculation circuit defined in the third aspect or the CRC code calculation method defined in the fifth aspect of the invention, it is constructed so that the residual portion in the parallel data final stage is detected and a desired CRC code is selected from plural CRC codes based on this detected result.

DETAILED DESCRIPTION OF THE PREFERRED EMBODIMENTS

An embodiment of the invention will be described in detail with reference to the accompanying drawings below.

Incidentally, in the embodiment, CRC code calculation from four-byte parallel data will be described for facilitating illustration.

First, a configuration will be described.

Figure 1:
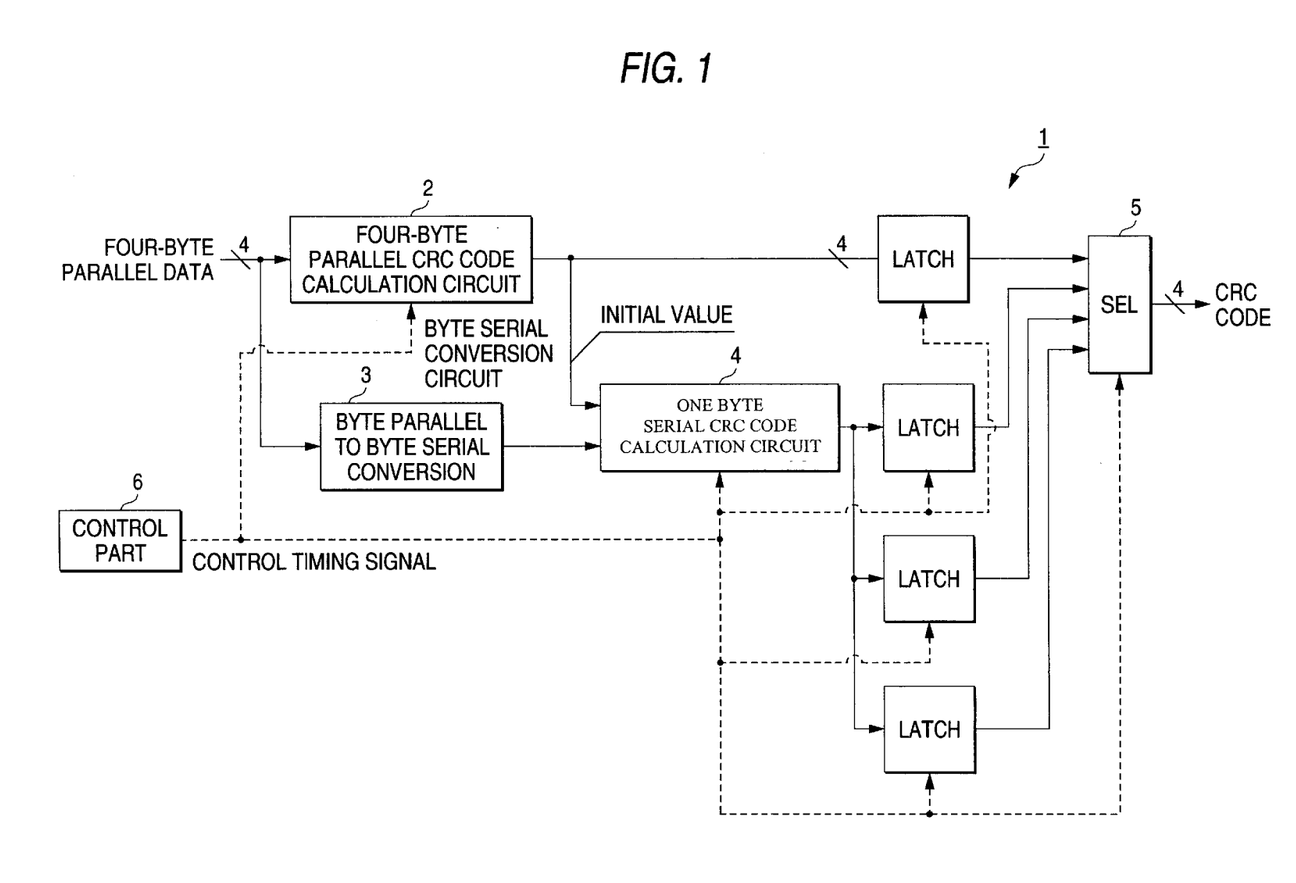
FIG. 1 is a block diagram showing a CRC code calculation circuit 1 to which the invention is applied.

As shown in FIG. 1, a CRC code calculation circuit 1 generally comprises a four-byte parallel CRC code calculation circuit 2, a byte serial conversion circuit 3, a one-byte serial CRC code calculation circuit 4, a SEL 5, and a control part 6.

The four-byte parallel CRC code calculation circuit 2 is a circuit for calculating a CRC code in parallel from data (see ①, ② of FIG. 3) except for a residual portion of four-byte parallel data (see four-byte parallel data D of FIG. 3) inputted from an external circuit (omission of being shown in the drawing) based on a control timing signal (whose detail is described later) inputted from the control part 6 and latching the calculated (intermediate) result to output the result to the SEL 5 and also outputting the result to the one-byte serial CRC code calculation circuit 4.

The byte serial conversion circuit 3 is a circuit for converting data (see ③ of FIG. 3) of a residual portion of the four-byte parallel data inputted from the external circuit (omission of being shown in the drawing) into one-byte serial data based on the control timing signal inputted from the control part 6 and outputting the converted one-byte serial data to the one-byte serial CRC code calculation circuit 4.

Also, when the residual portion is converted into a plurality of the one-byte serial data, the byte serial conversion circuit 3 outputs the plurality of the converted one-byte serial data to the one-byte serial CRC code calculation circuit 4 one by one sequentially.

The one-byte serial CRC code calculation circuit 4 is a circuit for calculating a CRC code in serial from the calculated intermediate result (CRC code) inputted from the four-byte parallel CRC code calculation circuit 2 and the one-byte serial data inputted from the byte serial conversion circuit 3 and latching the CRC code which is the calculated result to output the result to the SEL 5.

Also, when the one-byte serial data is further inputted, the one-byte serial CRC code calculation circuit 4 again calculates a CRC code from the calculated result and the inputted one-byte serial data and latches the calculated CRC code to output the code to the SEL 5.

The SEL 5 is means for selecting and outputting a desired CRC code from plural CRC codes inputted.

The control part 6 is means for outputting various control timing signals (various control signals described below) and performing control for calculating a CRC code from the four-byte parallel data inputted to the CRC code calculation circuit 1.

FIG. 2 is a block diagram showing a CRC code calculation circuit 10.

The CRC code calculation circuit 10 shown in FIG. 2 has the generally same configuration as that of the CRC code calculation circuit 1 of FIG. 1. Here, the same numeral is attached to the same configuration portion as that of the CRC code calculation circuit 1 and a description is omitted.

In FIG. 2, DFFs (D-type flip-flop) 1 to 8 are means for latching the CRC code calculated by each the CRC code calculation circuit 2, 4 and outputting the latched CRC code to the SEL 5. Also, a DFF 9 is means for selecting a desired CRC code of the inputted plural CRC codes as the final calculated result to the SEL 5.

The control part 6 is means for outputting various control signals described below and performing control for calculating a CRC code from the four-byte parallel data inputted to the CRC code calculation circuit 10.

Next, four-byte parallel data for calculating a CRC code and various control signals (CRCEN, STROBE, STATE[n]; corresponding to the control timing signal in FIG. 1) outputted from the control part 6 will be described briefly.

The four-byte parallel data is communication data in which a data frame is variable length, and is inputted to the four-byte parallel CRC code calculation circuit 2 and the byte serial conversion circuit 3.

A CRCEN (CRC ENABLE) signal, which is a signal for indicating a range calculating a CRC code, is inputted to the four-byte parallel CRC code calculation circuit 2.

A STROBE signal, which is a signal for indicating final stage data of the four-byte parallel data, is respectively inputted to the four-byte parallel CRC code calculation circuit 2, the byte serial conversion circuit 3, the one-byte serial CRC code calculation circuit 4, and the DFFs 8, 9.

A STATE [n] signal is a signal for indicating the number n of bytes (residual portion) included in the final stage data indicated by the STROBE signal.

Next, operations of the embodiment will be described.

A procedure of calculating a CRC code from the four-byte parallel data will be described with reference to FIG. 3.

Figure 3:
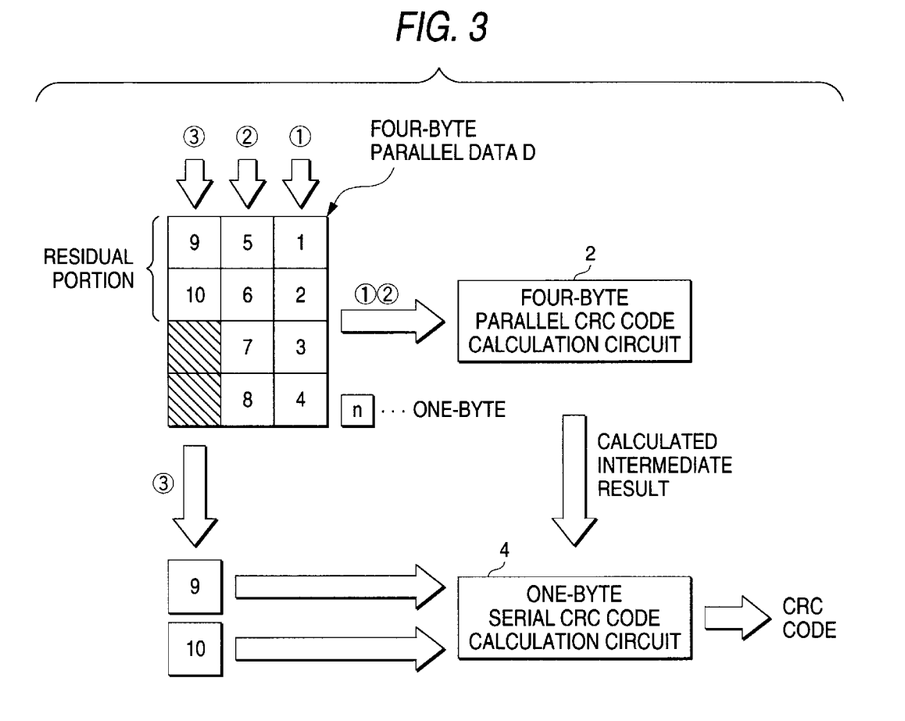
FIG. 3 is a diagram illustrating a procedure of calculating a CRC code from four-byte parallel data.

As shown in FIG. 3, four-byte parallel data D having a frame length (1 to 10) of ten bytes consists of three stages of ①(1 to 4), ②(5 to 8) and ③(9 to 10). The final stage ③ consists of a residual portion 9, 10 of two bytes and invalid data (shaded areas in FIG. 3) of two bytes.

The data ①, ② of the four-byte parallel data D is inputted to the four-byte parallel CRC code calculation circuit 2. Then, the four-byte parallel CRC code calculation circuit 2 calculates a CRC code from the inputted four-byte parallel data ①, ② and outputs the calculated CRC code (calculated intermediate result) to the one-byte serial CRC code calculation circuit 4.

Also, the data ③ of the four-byte parallel data D is converted into one-byte serial data 9, 10 by the byte serial conversion circuit (see numeral 3 of FIG. 1).

Then, the one-byte serial CRC code calculation circuit 4 calculates the calculated intermediate result inputted from the four-byte parallel CRC code calculation circuit 2 and the one-byte serial data 9. Further, a CRC code is calculated from the calculated result and the one-byte serial data 10.

Figure 4:
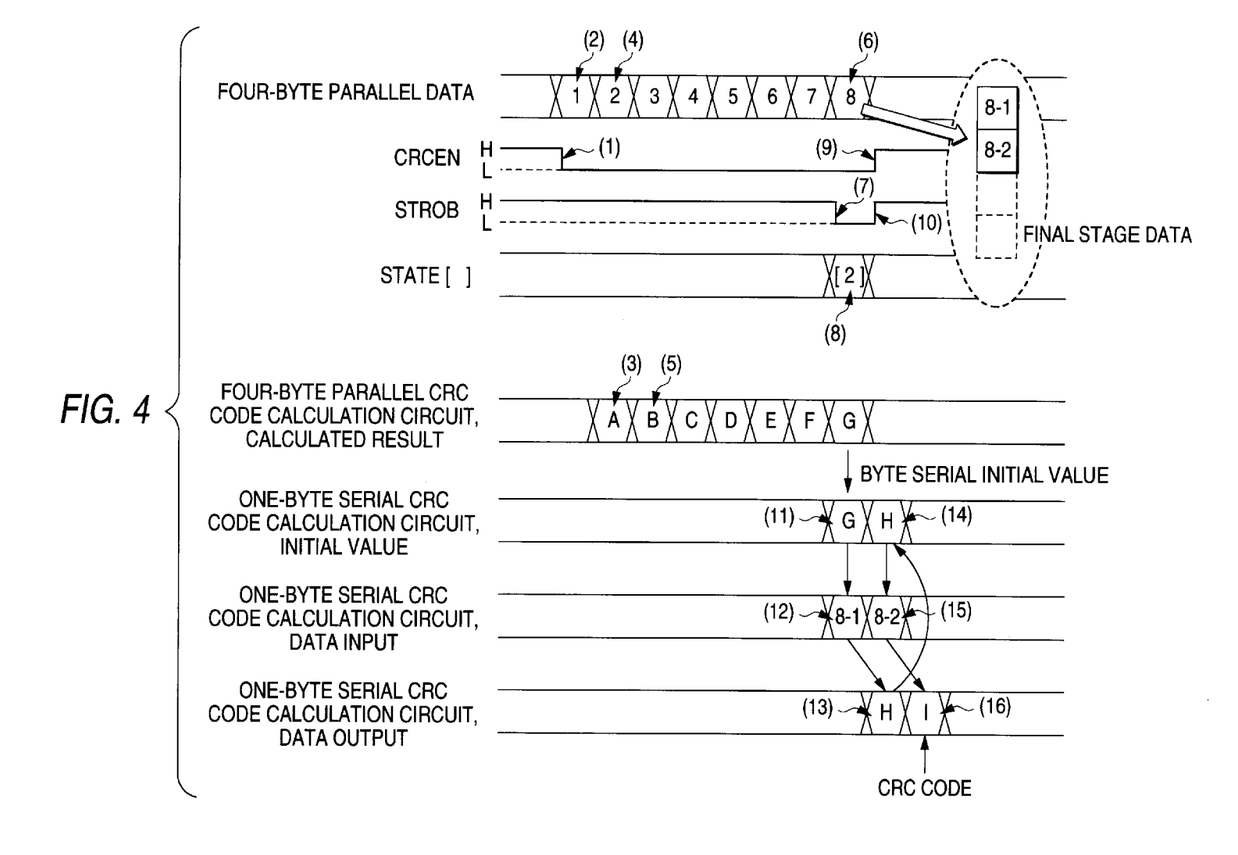
FIG. 4 is a timing chart showing calculation processing of a CRC code by the CRC code calculation circuit 10 shown in FIG. 2.

FIG. 4 is a timing chart showing calculation processing of a CRC code by the CRC code calculation circuit 10 shown in FIG. 2.

First, a CRC code calculation start signal is inputted to the four-byte parallel CRC code calculation circuit 2 (omission of being shown in the drawing).

Then, when a CRCEN signal outputted from the control part 6 changes to "L" (see (1) in the drawing) and four-byte parallel data 1 is inputted to the four-byte parallel CRC code calculation circuit 2 (see (2) in the drawing), the four-byte parallel CRC code calculation circuit 2 outputs a calculated result A (see (3) in the drawing).

Here, the calculated result A is a CRC code calculated from the four-byte parallel data 1.

Next, when four-byte parallel data 2 is inputted to the four-byte parallel CRC code calculation circuit 2 (see (4) in the drawing), the four-byte parallel CRC code calculation circuit 2 outputs a calculated result B (see (5) in the drawing). Here, the calculated result B is a CRC code obtained by calculating the calculated result A and the four-byte parallel data 2.

Subsequently, when four-byte parallel data 3 to 7 is inputted to the four-byte parallel CRC code calculation circuit 2 in order, the four-byte parallel CRC code calculation circuit 2 outputs calculated results C to G, respectively.

Next, four-byte parallel data 8 consisting of two-byte parallel data (8-1, 8-2) and invalid data of two bytes is inputted to the four-byte parallel CRC code calculation circuit 2 and the byte serial conversion circuit 3 (see (6) in the drawing).

At this time, a STROB signal outputted from the control part 6 changes to "L" (see (7) in the drawing) since the four-byte parallel data 8 is data of the final stage, and a STATE signal outputted from the control part 6 changes to [2] (see (8) in the drawing) since the number of significant bytes of the data 8 of the final stage is two bytes.

Then, after the four-byte parallel data 8 of the final stage is inputted, the CRCEN signal outputted from the control part 6 changes to "H" (see (9) in the drawing) while the STROB signal also changes to "H" (see (10) in the drawing).

Then, the byte serial conversion circuit 3 converts the inputted four-byte parallel data 8 into two one-byte serial data 8-1, 8-2 and outputs the data to the one-byte serial CRC code calculation circuit 4 in order of 8-1, 8-2.

Next, the one-byte serial CRC code calculation circuit 4 calculates a byte serial initial value G (see (11) in the drawing) inputted from the four-byte parallel CRC code calculation circuit 2 and the one-byte serial data 8-1 (see (12) in the drawing) inputted from the byte serial conversion circuit 3, and outputs a calculated result H (see (13) in the drawing).

Further, the one-byte serial CRC code calculation circuit 4 calculates the calculated result H (see (14) in the drawing) and the one-byte serial data 8-2 (see (15) in the drawing) inputted from the byte serial conversion circuit 3, and outputs a calculated result I (see (16) in the drawing).

Then, the calculated result I becomes a CRC code calculated from the four-byte parallel data 1 to 8 by the CRC code calculation circuit 1.

As described above, the CRC code calculation circuits 1 and 10 of the invention provide the byte serial conversion circuit 3 for converting the residual portion of the final stage of four-byte variable-length parallel data into serial data.

Also, there is provided the one-byte serial CRC code calculation circuit 4 for calculating a CRC code in serial from the serial data converted by the byte serial conversion circuit 3 using the calculated result of the four-byte parallel CRC code calculation circuit 2 as an initial value.

Therefore, the residual portion of the final stage of four-byte variable-length parallel data calculated by plural calculation circuits conventionally can be calculated by one serial calculation circuit (one-byte serial CRC code calculation circuit 4), so that a circuit scale of the CRC code calculation circuits 1 and 10 can be decreased and manufacturing costs can be reduced.

Incidentally, in the embodiment, the calculation circuit for calculating a CRC code from the four-byte parallel data is used in order to facilitate a description, but the invention is not limited to this and the number of bytes of parallel data may be set arbitrarily.

Also, both of the residual portion (9, 10) of the final stage (3) of the four-byte parallel data D shown in FIG. 3 and the residual portion (8-1, 8-2) of the final stage 8 of the four-byte parallel data 1 to 8 shown in FIG. 4 are set at two bytes, but the number of bytes of the residual portion may be set arbitrarily.

Also, a concrete circuit configuration of the CRC code calculation circuits 1 and 10 can be changed properly.

According to the invention, by converting the final stage of parallel data into serial data, CRC code calculation of a residual portion of the parallel data final stage can be calculated by one serial calculation circuit, so that a circuit scale of a CRC code calculation circuit can be decreased and manufacturing costs can be reduced.

What is claimed is:

1. A CRC code calculation circuit for calculating a CRC code from parallel data having a residual portion in a final stage, comprising:

a parallel calculator for calculating a CRC code in parallel from the parallel data except the final stage;

a converter for converting the final stage into serial data;

a serial calculator for calculating a CRC code in serial from the CRC code calculated by said parallel calculator and the serial data converted by said converter; and a CRC code selector for selecting a desired CRC code from the plural CRC codes calculated by said parallel calculator and said serial calculator.

2. A CRC code calculation circuit as defined in claim 1, further comprising a final stage detector for detecting the final stage of the parallel data;

wherein said converter converts the final stage detected by the final stage detection means into serial data.

3. A CRC code calculation circuit as defined in claim 2, further comprising a residual portion detector for detecting the residual portion from the final stage detected by said final stage detector;

wherein said CRC code selector selects a desired CRC code based on a detected result of said residual portion detector.

4. A CRC code calculation method for calculating a CRC code from parallel data having a residual portion in a final stage, comprising:

a final stage detection step of detecting the final stage of the parallel data;

a conversion step of converting the final stage detected by the final stage detection step into serial data;

a parallel calculation step of calculating a CRC code in parallel from the parallel data except the final stage;

a serial calculation step of calculating a CRC code in serial from the parallel calculation result and the serial data converted by the conversion step; and a selection step of selecting a desired CRC code from the CRC code calculated by the parallel calculation step and the CRC code calculated by the serial calculation step.

5. A CRC code calculation method as defined in claim 4, further comprising a residual portion detection step of detecting the residual portion from the final stage detected by the final stage detection step;

wherein the selection step selects a desired CRC code from the CRC code calculated by the parallel calculation step and the CRC code calculated by the serial calculation step based on a detected result in the residual portion detection step.

* * * * *